US012771345B2

(12) United States Patent
Miao et al.

(10) Patent No.: US 12,771,345 B2
(45) Date of Patent: Oct. 20, 2026

(54) TUNABLE HOMOJUNCTION FIELD EFFECT DEVICE-BASED UNIT CIRCUIT AND MULTI-FUNCTIONAL LOGIC CIRCUIT

(71) Applicant: NANJING UNIVERSITY, Nanjing (CN)

(72) Inventors: Feng Miao, Nanjing (CN); Shijun Liang, Nanjing (CN); Chen Pan, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 1014 days.

(21) Appl. No.: 17/924,722

(22) PCT Filed: Jul. 2, 2020

(86) PCT No.: PCT/CN2020/099817
§ 371 (c)(1),
(2) Date: Nov. 11, 2022

(87) PCT Pub. No.: WO2022/000395
PCT Pub. Date: Jan. 6, 2022

(65) Prior Publication Data
US 2023/0198520 A1 Jun. 22, 2023

(30) Foreign Application Priority Data
Jun. 28, 2020 (CN) ......................... 202010596101.5

(51) Int. Cl.
*H03K 17/687* (2006.01)
*G06F 7/50* (2006.01)
(Continued)

(52) U.S. Cl.
CPC ........... *H03K 17/6872* (2013.01); *G06F 7/50* (2013.01); *H03K 19/17724* (2013.01); *H03K 19/20* (2013.01)

(58) Field of Classification Search
CPC ......... H03K 17/6872; H03K 19/17724; H03K 19/20; H03K 19/0948; G06F 7/50
See application file for complete search history.

(56) References Cited

U.S. PATENT DOCUMENTS 12,670,368 B2 * 6/2026 Miao ...................... G06N 3/061
2020/0099379 A1 * 3/2020 Sharma .................. H03K 19/10
(Continued)

FOREIGN PATENT DOCUMENTS

JP 11-96276 * 4/1999 ............... G06G 7/14

*Primary Examiner* — Dao H Nguyen
(74) *Attorney, Agent, or Firm* — CBM PATENT CONSULTING, LLC

(57) ABSTRACT

A tunable homojunction field effect device-based unit circuit and a multifunctional logic circuit, and the corresponding design scheme includes four steps: a structural construction of the tunable homojunction device, an implementation of multi-functional electrical operations of the tunable homojunction device, a design of a basic logic unit circuit, and an implementation of complex logic functions by a cascaded unit logic circuit; the first designs a tunable homojunction device based on a material with bipolar field effect characteristics; and then introduces the polarity of source-drain voltage into the device as an additional control signal; further, by cascading three reconfigurable logic units, the multi-functional logic circuit that can perform logic functions of full adder and subtractor is designed; the logic unit circuit designed in the present invention has the ability to perform reconfigurable logic functions.

8 Claims, 5 Drawing Sheets

(51) Int. Cl.
*H03K 19/17724* (2020.01)
*H03K 19/20* (2006.01)

(56) References Cited

U.S. PATENT DOCUMENTS

| | | | | |
|---|---|---|---|---|
| 2021/0257014 | A1* | 8/2021 | Lu | G06N 3/06 |
| 2022/0294449 | A1* | 9/2022 | Gaul | H03K 19/10 |

* cited by examiner

| Implementation scheme of multi-functional operations of tunable homojunction field effect device | | | | | | |
|---|---|---|---|---|---|---|
| $V_{ds}$ | $V_{gA}$ | $V_{gB}$ | Channel homojunction state | Current state | Device function | |
| >0 | >0 | >0 | NN junction | on | N-type FET | FET |
| | | <0 | NP junction | off | | |
| <0 | <0 | <0 | PP junction | on | P-type FET | |
| | | >0 | PN junction | off | | |
| >0 | <0 | >0 | PN junction | on | forward diode | unidirectional diode |
| <0 | | | PN junction | off | | |
| <0 | >0 | <0 | NP junction | on | reverse diode | |
| >0 | | | NP junction | off | | |

FIG. 4

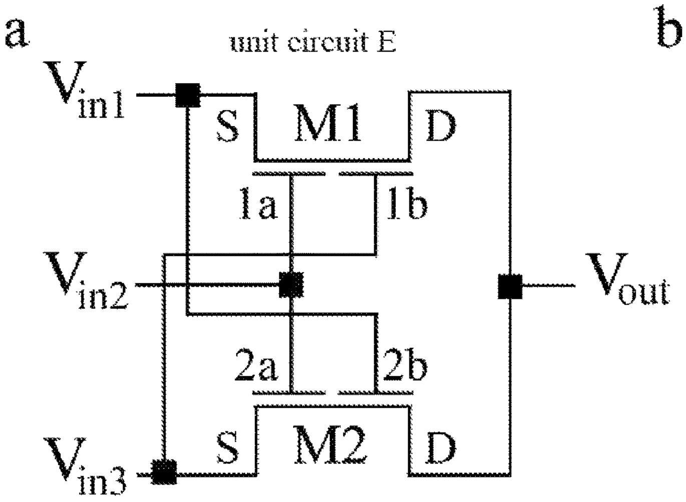

FIG. 5a b

| $V_{in1}$ | $V_{in2}$ | $V_{in3}$ | $V_{out}$ |
|---|---|---|---|
| A | 1 | B | $AB$ |
| A | 0 | B | $A+B$ |
| 1 (or 0) | A | 0 (or 1) | $\overline{A}$ |
| 1 (or 0) | 1 (or 0) | A | A |
| 1 | 0 | A | 1 |
| 0 | 1 | A | 0 |
| A | B | 1 | $A+\overline{B}$ |
| A | B | 0 | $A\overline{B}$ |
| A | C | B | $AB+A\overline{C}+B\overline{C}$ |

FIG. 5b

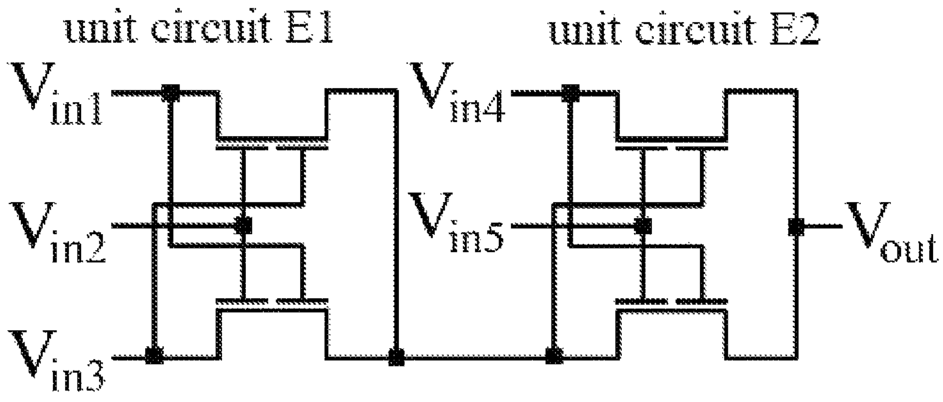
FIG. 6a
| $V_{in1}$ | $V_{in2}$ | $V_{in3}$ | $V_{in4}$ | $V_{in5}$ | $V_{out}$ |
|---|---|---|---|---|---|
| A | 1 | B | C | 1 | ABC |
| | 1 | | | 0 | AB+C |
| | 0 | | | 1 | (A+B) C |
| | 0 | | | 0 | A+B+C |
FIG. 6b
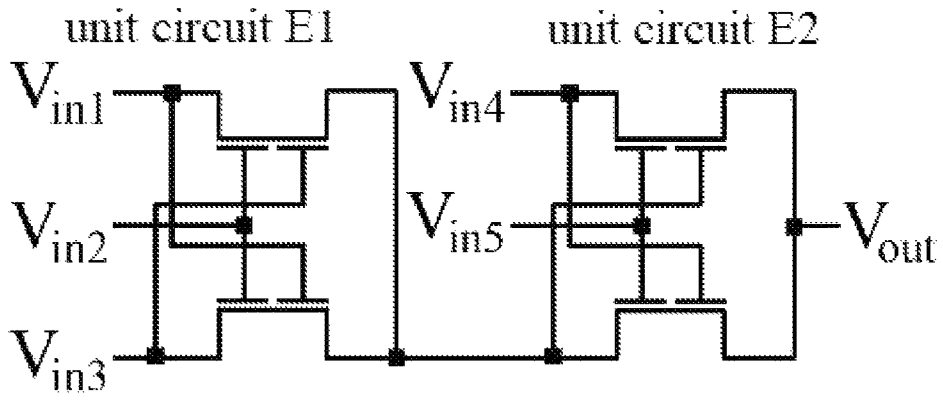
FIG. 7a

| $V_{in1}$ | $V_{in2}$ | $V_{in3}$ | $V_{in4}$ | $V_{in5}$ | $V_{out}$ |
|---|---|---|---|---|---|
| A | 1 | B | C | 1 | ABC |
| | 1 | | | 0 | AB+C |
| | 0 | | | 1 | (A+B) C |
| | 0 | | | 0 | A+B+C |

| A | B | C | $B_{out}$ | $C_{out}$ | Sum or Diff |
|---|---|---|---|---|---|
| 1 | 1 | 1 | 1 | 1 | 1 |
| 1 | 1 | 0 | 0 | 1 | 0 |
| 1 | 0 | 1 | 0 | 1 | 0 |
| 1 | 0 | 0 | 0 | 0 | 1 |
| 0 | 1 | 1 | 1 | 1 | 0 |
| 0 | 1 | 0 | 1 | 0 | 1 |
| 0 | 0 | 1 | 1 | 0 | 1 |
| 0 | 0 | 0 | 0 | 0 | 0 |

FIG. 8b

TUNABLE HOMOJUNCTION FIELD EFFECT DEVICE-BASED UNIT CIRCUIT AND MULTI-FUNCTIONAL LOGIC CIRCUIT

TECHNICAL FIELD

The present invention relates to the field of semiconductor materials and devices, and particularly to a tunable homojunction field effect device-based unit circuit, and a multi-functional logic circuit and an adder-subtractor logic circuit obtained based on the unit circuit.

BACKGROUND

With the emergence of novel electronic application industries such as artificial intelligence, Internet of Things, implantable medical care, etc., multi-functional logic circuits that satisfy emerging requirements such as low power consumption, flexibility, biocompatibility, and the like have gradually become a research hotspot. Conventional silicon-based logic circuits hardly meet the diverse application requirements as enumerated. On the one hand, silicon-based devices have a single function, and constructing multi-functional logic circuits consumes a lot of transistor resources, which will increase the power consumption of a circuit. Furthermore, silicon-based devices are undesirable in terms of flexibility and biocompatibility, making a huge impediment to the application of silicon-based logic circuits in related fields.

SUMMARY

Objective of the present invention: To overcome the deficiencies of the prior art, the present invention provides a tunable homojunction field effect device-based unit circuit, which solves the problem of a multi-functional logic circuit requiring many transistors and wasting resources.

Technical solution: On one aspect, the present invention discloses a tunable homojunction field effect device-based unit circuit, and the unit circuit E includes:

- a first input terminal $V_{in1}$ for receiving a first input voltage signal;
- a second input terminal $V_{in2}$ for receiving a second input voltage signal;
- a third input terminal $V_{in3}$ for receiving a third input voltage signal;
- a first tunable homojunction field effect transistor M1, wherein a source S1 of the first tunable homojunction field effect transistor M1 is coupled to the first input terminal, a gate electrode 1*a* close to the source S1 is connected to the second input terminal, and a gate electrode 1*b* close to a drain of the first tunable homojunction field effect transistor M1 is coupled to the third input terminal;
- a second tunable homojunction field effect transistor M2, wherein a source S2 of the second tunable homojunction field effect transistor M2 is coupled to the third input terminal, a gate electrode 2*a* close to the source S2 is connected to the second input terminal, and a gate electrode 2*b* close to a drain of the second tunable homojunction field effect transistor M2 is coupled to the first input terminal.

The drain of the first tunable homojunction field effect transistor is connected to the drain of the second tunable homojunction field effect transistor, and the output of the connection point therebetween is used as an output terminal $V_{out}$.

The first tunable homojunction field effect transistor M1 and the second tunable homojunction field effect transistor M2 have the same structure, including a substrate insulating material, a channel material layer, an insulating layer, and a metal electrode layer. The metal electrode layer includes a drain electrode layer, a source electrode layer, a gate electrode layer A, and a gate electrode layer B. The gate electrode layer A and the gate electrode layer B are fabricated side by side on the substrate insulating material, and a gap is left between the gate electrode layer A and the gate electrode layers B to ensure electrical insulation therebetween. The insulating layer completely covers the gate electrode layer A and the gate electrode layer B. The drain electrode layer is placed on the left edge of the channel material layer above the gate electrode layer A, and the source electrode layer is placed on the right edge of the channel material layer above the gate electrode layer B. That is, the gate electrode layer A corresponds to the gate electrode 1*b* of M1, and the gate electrode layer A corresponds to the gate electrode 2*b* of M2. The gate electrode layer B corresponds to the gate electrode 1*a* of M1, and the gate electrode layer B corresponds to the gate electrode 2*a* of M2.

Further, including:

- If the first input terminal $V_{in1}$ and the third input terminal $V_{in3}$ input a signal A and a signal B, respectively, when the second input terminal $V_{in2}$ inputs a high level, the output terminal $V_{out}$ outputs an AND gate, and the logical operation result is AB,
- when the second input terminal $V_{in2}$ inputs a low level, the output terminal $V_{out}$ outputs an OR gate, and the logical operation result is A+B,
- when the second input terminal $V_{in2}$ inputs a signal C, the output terminal $V_{out}$ outputs a borrow operation in subtractions, and the logical operation result is $AB+A\overline{C}+B\overline{C}$.

If the first input terminal $V_{in1}$ and the second input terminal $V_{in2}$ input the signal A and the signal B, respectively, when the third input terminal $V_{in3}$ is at a high level, the output terminal $V_{out}$ outputs the logic operation result $A+\overline{B}$, and when the third input terminal $V_{in3}$ is at a low level, the output terminal $V_{out}$ outputs the logic operation result $A\overline{B}$.

If the third input terminal $V_{in2}$ inputs the signal A, and the first input terminal $V_{in1}$ and the second input terminal $V_{in2}$ are at the same level, the output terminal is a signal following, and the logical operation result is A.

If the third input terminal $V_{in3}$ inputs the signal A, the first input terminal $V_{in1}$ is at a high level, and the second input terminal $V_{in2}$ is at a low level, the output signal is always at a high level. If the first input terminal $V_{in1}$ is at a low level, and the second input terminal $V_{in2}$ is at a high level, the output signal is always at a low level.

If the first input terminal $V_{in1}$ and the third input terminal $V_{in3}$ are at opposite levels, and the second input terminal $V_{in2}$ is the input signal A, the output terminal $V_{out}$ implements a NOT gate, and the logical operation result is $\overline{A}$.

The present invention also discloses a multi-functional logic circuit, which includes two unit circuits as described above. The two unit circuits are denoted as a logic circuit E1 and a logic circuit E2, respectively. The output terminal corresponding to the logic circuit E1 is connected to the second input terminal of the logic circuit E2 to form a logic circuit with five input terminals and one output terminal, which are respectively denoted as a first input terminal $V_{in1}$, a second input terminal $V_{in2}$, a third input terminal $V_{in3}$, a fourth input terminal $V_{in4}$, and a fifth input terminal $V_{in5}$.

Further, including:

If the first input terminal $V_{in1}$ and the third input terminal $V_{in3}$ input the signals A and B, respectively, and the fourth input terminal $V_{in4}$ and the fifth input terminal $V_{in5}$ input opposite levels, when the second input terminal $V_{in2}$ inputs a high level, an AND-OR gate is implemented with the logic operation result of $\overline{AB}$, when the second input terminal $V_{in2}$ inputs a low level, an OR-NOT gate is implemented with the logic operation result of $\overline{A+B}$.

If the fourth input terminal $V_{in4}$ and the fifth input terminal $V_{in5}$ input the signals A and B, respectively, the second input terminal $V_{in2}$ inputs the signal C, and the first input terminal $V_{in1}$ and the third input terminal $V_{in3}$ input opposite levels, a majority gate is implemented with the logic operation result of AB+BC+AC.

The present invention further discloses a multi-functional logic circuit, which includes two unit circuits as described above. The two unit circuits are denoted as a logic circuit E1 and a logic circuit E2, respectively. The output terminal corresponding to the logic circuit E1 is connected to the third input terminal of the logic circuit E2 to form a logic circuit with five input terminals and one output terminal $V_{out}$, which are respectively denoted as a first input terminal $V_{in1}$, a second input terminal $V_{in2}$, a third input terminal $V_{in3}$, a fourth input terminal $V_{in4}$, and a fifth input terminal $V_{in5}$.

Further, including:

If the first input terminal $V_{in1}$, the third input terminal $V_{in3}$, and the fourth input terminal $V_{in4}$ input the signals A, B, and C, respectively, when both the second input terminal $V_{in2}$ and the fifth input terminal $V_{in5}$ input a high level, an AND gate is implemented, and the output terminal $V_{out}$ outputs ABC;

when both the second input terminal $V_{in2}$ and the fifth input terminal $V_{in5}$ input a low level, an OR gate is implemented, and the output terminal $V_{out}$ outputs A+B+C;

when the second input terminal $V_{in2}$ is at a high level and the fifth input terminal $V_{in5}$ inputs a low level, an AND-OR gate is implemented, and the output terminal $V_{out}$ outputs AB+C;

when the second input terminal $V_{in2}$ is at a low level and the fifth input terminal $V_{in5}$ inputs a high level, an OR-AND gate is implemented, and the output terminal $V_{out}$ outputs (A+B)C.

In addition, the present invention also discloses an adder-subtractor logic circuit, which is formed by connecting three unit circuits described above in series, denoted as a first unit, a second unit, and a third unit, respectively. The specific connection mode is as follows:

The first input terminal of the first unit is connected to the first input terminal of the second unit, which serves as the first input terminal of the adder-subtractor logic circuit and inputs a signal B;

The second input terminal of the first unit is connected to the third input terminal of the third unit, which serves as the second input terminal of the adder-subtractor logic circuit and inputs a signal A;

The third input terminal of the first unit is connected to the third input terminal of the second unit, which serves as the third input terminal of the adder-subtractor logic circuit and inputs a signal C;

The output terminal of the first unit is connected to the second input terminal of the second unit and the first input terminal of the third unit, which serves as the first output terminal of the adder-subtractor logic circuit and outputs a signal $B_{out}$;

The output terminal of the second unit is connected to the second input terminal of the third unit, which serves as the second output terminal of the adder-subtractor logic circuit and outputs a signal $C_{out}$;

The output terminal of the third unit is used as the adder signal output terminal of the adder-subtractor logic circuit to output a signal Sum or as the subtractor signal output terminal of the adder-subtractor logic circuit to output a signal Diff.

Further, including:

The input signal and the output signal satisfy the Boolean logic operation: $B_{out}=BC+B\overline{A}+C\overline{A}$;

The input signal and the output signal satisfy the Boolean logic operation: $C_{out}=BC+B\overline{B_{out}}+C\overline{B_{out}}=BC+BA+CA$;

The input signal and the output signal satisfy the Boolean logic operation: $Sum/Diff=AB_{out}+A\overline{C_{out}}+B_{out}\overline{C_{out}}=A\oplus B\oplus C$, where the output signals $B_{out}$ and Diff respectively represent results of the borrow operation and the difference operation of subtractor, and the output signals $C_{out}$ and Sum respectively represent results of the carry operation and the summation operation of adder.

Beneficial effects: 1. The present invention discloses a design scheme of a multi-functional logic circuit based on a tunable homojunction field effect device. Through the operation of voltage biasing of two discrete gate electrodes, device channels can achieve different homojunction states. Further, applying source-drain voltages of different polarities makes a homojunction in a working state of forward bias or reverse bias, so that the device can exhibit a variety of switching functions. One device can implement a variety of functions, which saves costs and resources. 2. By making full use of device functions, the logic unit circuit designed in the present invention has the ability to perform reconfigurable logic functions. Further, the logic circuit constructed by cascading unit circuits can not only perform logic functions of full adder, subtractor, etc. but also require greatly reduced transistor resources and occupied area compared with traditional complementary metal-oxide-semiconductor (CMOS) technology. Therefore, the structure proposed by the present invention is simpler, and the design scheme for the circuit with reconfigurable logic function is highly competitive in terms of meeting the low power consumption application requirements in the future.

BRIEF DESCRIPTION OF THE DRAWINGS

FIG. 4 is a device function table of the tunable homojunction field effect device of Embodiment 1 under different electrical operations;

FIG. 5*a* is a schematic diagram of the unit circuit of Embodiment 1: a circuit structure diagram;

FIG. 5*b* is a schematic diagram of the unit circuit of Embodiment 1: a function table of a multi-functional circuit;

FIG. 6*a* is a schematic diagram of a logic circuit composed of the unit circuit of Embodiment 1: a circuit structure diagram;

FIG. 6*b* is a schematic diagram of a logic circuit composed of the unit circuit of Embodiment 1: a function table of a multi-functional circuit;

FIG. 7*a* is a schematic diagram of another logic circuit composed of the unit circuit of Embodiment 1: a circuit structure diagram;

FIG. 8*b* is a schematic diagram of the adder-subtractor circuit of Embodiment 1: a truth table of input and output signals of a multi-functional circuit.

DETAILED DESCRIPTION OF THE EMBODIMENTS

Embodiment 1

Figure 1:
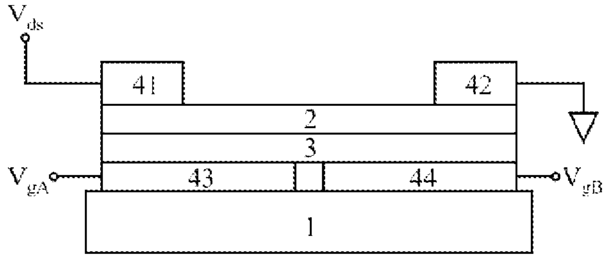
FIG. 1 is a front view of the tunable homojunction field effect device of Embodiment 1.
Figure 2:
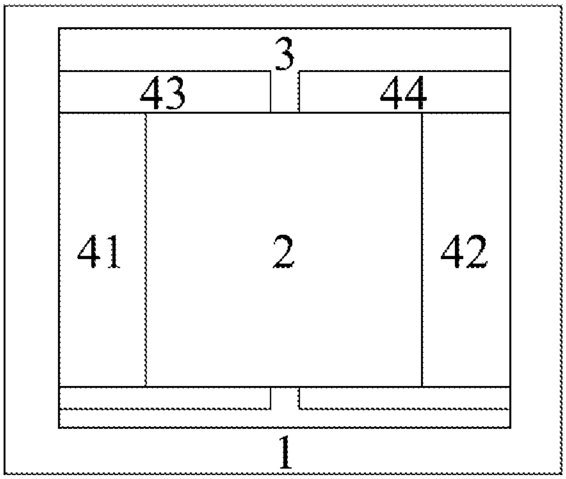
FIG. 2 is a top view of the tunable homojunction field effect device of Embodiment 1.
Figure 3:
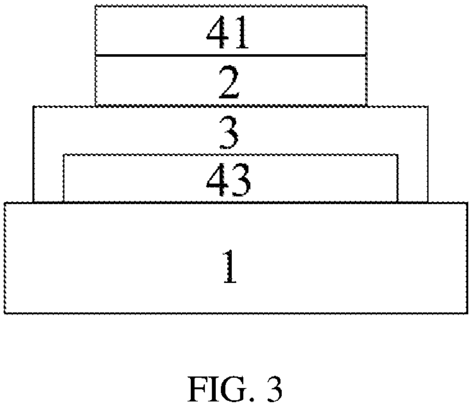
FIG. 3 is a right view of the tunable homojunction field effect device of Embodiment 1.

As shown in FIG. 1, FIG. 2, and FIG. 3, the present invention first introduces a tunable homojunction-based field effect device, which includes an insulating layer 3, a metal electrode layer, a channel material layer 2, and a substrate insulating material 1. The metal electrode layer includes a drain electrode layer 41, a source electrode layer 42, a gate electrode layer A43, and a gate electrode layer B44.

The gate electrode layer A43 and the gate electrode layer B44 are fabricated side by side on the substrate insulating material 1, and a gap is left therebetween to ensure that the gate electrode layer A43 and the gate electrode layer B44 are non-conducting. The insulating layer 3 is laid on the gate electrode layer A43 and the gate electrode layer B44. The channel material layer 2 is laid on overlapping areas between the gate electrode layer A43 and the insulating layer 3 and between the gate electrode layer B44 and the insulating layer 3, so that the channel material layer 2 is completely isolated from the gate electrode layer A43 and the gate electrode layer B44 by the insulating layer 3, respectively. The drain electrode layer 41 and the source electrode layer 42 are fabricated directly above the channel material layer 2 and placed directly above the left edges and the right edges of the gate electrode layer A43 and the gate electrode layer B44, respectively, while ensuring that the drain electrode layer 41 and the source electrode layer 42 are completely isolated from the gate electrode layer A43 and the gate electrode layer B44 by the insulating layer 3.

In the present embodiment, the channel material layer 2 is an intrinsic semiconductor with a band gap ranging from 0.5 eV to 1.5 eV and a material thickness of less than 30 nm, which can exhibit bipolar field effect characteristics. The channel material layer 2 can be selected from low-dimensional semiconductor materials such as silicon nanowires, carbon nanotubes, two-dimensional layered materials, or organic semiconductor thin film materials. The metal work function of the drain electrode layer 41 and the source electrode layer 42 is the middle energy value of the band gap of the channel material layer.

In the present embodiment, the gate insulating layer can be selected from insulating material layers such as a silicon dioxide layer, an aluminum oxide layer, a hafnium oxide layer, a hexagonal boron nitride layer, and a zirconium oxide layer.

As shown in FIG. 1, the drain electrode layer 41 is applied with the bias voltage $V_{ds}$, the source electrode layer 42 is grounded, the gate electrode layer A43 is applied with the gate voltage $V_{gA}$, and the gate electrode layer B44 is applied with the gate voltage $V_{gB}$.

In the present embodiment, the channel material layer of the device can be regulated to be an NN-type homojunction, a PP-type homojunction, a PN-type homojunction, and an NP-type homojunction under gate voltage bias. Under the operation of source-drain voltages ($V_{ds}$) of different polarities, the forward bias or reverse bias state of the homojunction is further realized to determine whether the current state of the device is on or off. The specific regulation method is as follows:

As shown in FIG. 4, in the present embodiment, when $V_{ds}>0$ and $V_{gA}>0$, the device scans $V_{gB}$ to realize the function of N-type field effect transistor (FET) device. When $V_{gB}>0$, the channel homojunction state is an NN junction, and the current state is on. When $V_{gB}<0$, the channel homojunction state is an NP junction, and the current state is off.

In the present embodiment, when $V_{ds}<0$ and $V_{gA}<0$, the device scans $V_{gB}$ to realize the function of P-type FET device. When $V_{gB}>0$, the channel homojunction state is a PN junction, and the current state is off. When $V_{gB}<0$, the channel homojunction state is a PP junction, and the current state is on.

In the present embodiment, under the combined operation of $V_{gA}<0$ and $V_{gB}>0$, the channel homojunction state of the device is regulated as a PN junction, and the device scans $V_{ds}$ to realize the function of a forward diode device and acts as a forward diode. When $V_{ds}>0$, the channel homojunction state is a forward-biased PN junction, and the current state is on. When $V_{ds}<0$, the channel homojunction state is a reverse-biased PN junction, and the current state is off.

In the present embodiment, under the combined operation of $V_{gA}>0$ and $V_{gB}<0$, the channel homojunction state of the device is regulated as an NP junction, exhibiting a reverse diode, and the device scans $V_{ds}$ to realize the function of a forward diode device. When $V_{ds}>0$, the channel homojunction state is a forward-biased NP junction, and the current state is off. When $V_{ds}<0$, the channel homojunction state is a reverse-biased NP junction, and the current state is on.

Thus, a single device can achieve device functions of N-type FET, P-type FET, forward diode, and reverse diode under different electrical operations.

As shown in FIG. 5*a*, a multi-functional unit circuit structure E is constructed based on the above-mentioned tunable homojunction field effect device and includes:

- a first input terminal $V_{in1}$ for receiving a first input voltage signal;
- a second input terminal $V_{in2}$ for receiving a second input voltage signal;
- a third input terminal $V_{in3}$ for receiving a third input voltage signal;
- a first tunable homojunction field effect transistor M1, wherein a source S1 of the first tunable homojunction field effect transistor M1 is coupled to the first input terminal, a gate electrode 1*a* close to the source S1 is connected to the second input terminal, and a gate electrode 1*b* close to a drain of the first tunable homojunction field effect transistor M1 is coupled to the third input terminal;
- a second tunable homojunction field effect transistor M2, wherein a source S2 of the second tunable homojunction field effect transistor M2 is coupled to the third input terminal, a gate electrode 2*a* close to the source S2 is connected to the second input terminal, and a gate electrode 2*b* close to a drain of the second tunable homojunction field effect transistor M2 is coupled to the first input terminal.

The drain D of the first tunable homojunction field effect transistor is connected to the drain D of the second tunable homojunction field effect transistor, and the output of the connection point therebetween is used as an output terminal $V_{out}$.

In the present embodiment, for the device M1, the input signal $V_{in2}$ and the input signal $V_{in3}$ determine the type of the device channel homojunction, that is, NN junction, PN junction, PP junction, or NP junction, and the relative potential between the input signal $V_{in1}$ and the input signal $V_{in2}$ determines the source-drain voltage bias polarity of the device. For the device M2, the input signal $V_{in1}$ and the input signal $V_{in2}$ determine the type of the device channel homojunction, that is, NN junction, PN junction, PP junction, and NP junction, and the relative potential between the input signal $V_{in1}$ and the input signal $V_{in2}$ determines the source-drain voltage bias polarity of the device.

In the present embodiment, the circuit shown in FIG. 5*a*, when designed according to the scheme of the input signals $V_{in1}$, $V_{in2}$, and $V_{in3}$ shown in FIG. 5*b*, will show nine different logic operation functions in sequence, including the 'AND gate' with the logic operation result of AB; the 'OR gate' with the logic operation result of A+B; the 'Not gate' with the logic operation result of $\overline{A}$; the signal following with the logic operation result of A; the maintenance of high level output with the logic operation result of 1; the maintenance of low level output with the logic operation result of 0; the 'material implication' with the logic operation result of $A+\overline{B}$; the 'NOT' operation of 'material implication' with the logic operation result of $A\overline{B}$; and the borrow operation in subtractions with the logic operation result of $AB+A\overline{C}+B\overline{C}$.

In the present embodiment, the circuit shown in FIG. 5*a* can be used to realize three most basic logic functions, 'AND', 'OR', and 'NOT'. In principle, the combination of these three logic functions can implement arbitrary logic functions. Further, the circuit can perform the 'material implication' logical operation and thus is suitable for more diverse logic constructions. Therefore, taking the circuit of FIG. 1*a* as a basic unit and by cascading and combining the basic units of the circuit, a logic circuit capable of performing an arbitrary computing function can be efficiently constructed.

The specific implementation method of the nine operation functions is as shown in FIG. 5*b:*

1. The input signal $V_{in1}$ and the input signal $V_{in3}$ respectively input a signal A and a signal B, the input signal $V_{in2}$ is at a fixed high level (logic 1), the output signal $V_{out}$ is 'AND gate', respectively, and the logic operation result is AB;

The input signal $V_{in2}$ is at a fixed low level (logic 0), the output signal $V_{out}$ is an 'OR gate', respectively, and the logic operation result is A+B.

2. The input signal $V_{in1}$ is at a high level (logic 1), the input signal $V_{in3}$ is at a low level (logic 0), or the input signal $V_{in1}$ is at a low level (logic 0), the input signal $V_{in3}$ is at a high level (logic 1), and the input signal $V_{in2}$ is the input signal A, then the output signal $V_{out}$ is 'Not gate', and the logic operation result is $\overline{A}$.

3. The input signal $V_{in1}$ and the input signal $V_{in2}$ are both at a high level (logic 1), or the input signal $V_{in1}$ and the input signal $V_{in2}$ are both at a low level (logic 0), and the input signal $V_{in3}$ is the input signal A, then the output signal $V_{out}$ is the logical operation result is A.

4. The input signal $V_{in1}$ is at a high level (logic 1), the input signal $V_{in2}$ is at a low level (logic 0), and the input signal $V_{in3}$ is the input signal A, then the output signal is always at a high level (logic 1).

5. The input signal $V_{in1}$ is at a low level (logic 0), the input signal $V_{in2}$ is at a high level (logic 1), and the input signal $V_{in3}$ is the input signal A, then the output signal is always at a low level (logic 0).

6. The input signal $V_{in1}$ and the input signal Vint respectively input the signal A and the signal B, the input signal $V_{in3}$ is at a fixed high level (logic 1), the output signal $V_{out}$ is the logic operation result of $A+\overline{B}$, the input signal $V_{in3}$ is at a fixed low level (logic 0), the output signal $V_{out}$ is the logic operation result of $A\overline{B}$.

7. The input signal $V_{in1}$, the input signal $V_{in2}$, and the input signal $V_{in3}$ respectively input the signal A, the signal B, and the signal C, then the output signal $V_{out}=AB+A\overline{C}+B\overline{C}$.

In the present embodiment, only two components are required to implement various logic functions, which saves resources.

Further, as shown in FIG. 6, in the present embodiment, on the basis of the multi-functional unit circuit structure E described above, two circuit basic units as shown in FIG. 5*a* are cascaded. The circuit cascade mode is shown in FIG. 6*a*. The output terminal corresponding to the logic circuit E1 is connected to the second input terminal of the logic circuit E2 to form a logic circuit with five input terminals and one output terminal, which are respectively denoted as the first input terminal $V_{in1}$, the second input terminal $V_{in2}$, the third input terminal $V_{in3}$, the fourth input terminal $V_{in4}$, and the fifth input terminal $V_{in5}$.

In the present embodiment, based on the circuit structure shown in FIG. 6*a* and under the input signal operation mode shown in FIG. 6*b*, the 'NAND gate' with the logical operation result of $\overline{AB}$, the 'NOR gate' with the logic operation result of $\overline{A+B}$, and the 'majority gate' with the logic operation result of AB+BC+AC can be implemented in sequence. The specific implementation method is:

(1) If the first input terminal $V_{in1}$ and the third input terminal $V_{in3}$ input the signals A and B, respectively, and the fourth input terminal $V_{in4}$ and the fifth input terminal $V_{in5}$ input opposite levels, when the second input terminal $V_{in2}$ inputs a high level, the NAND gate is implemented with the logic operation result of $\overline{AB}$;

(2) When the second input terminal $V_{in2}$ inputs a low level, the NOR gate is implemented with the logic operation result of $\overline{AB}$;

(3) If the fourth input terminal $V_{in4}$ and the fifth input terminal $V_{in5}$ input the signals A and B, respectively, the second input terminal $V_{in2}$ inputs the signal C, and the first input terminal $V_{in1}$ and the third input terminal $V_{in3}$ input opposite levels, then the majority gate is implemented with the logic operation result of AB+BC+AC.

Further, as shown in FIG. 7, in the present embodiment, two circuit basic units shown in FIG. 5*a* are cascaded with the circuit cascade mode shown in FIG. 7*a* and respectively denoted as the logic circuit E1 and the logic circuit E2. The output terminal corresponding to the logic circuit E1 is connected to the third input terminal of the logic circuit E2 to form a logic circuit with five input terminals and one output terminal $V_{out}$, which are respectively denoted as the first input terminal $V_{in1}$, the second input terminal $V_{in2}$, the third input terminal $V_{in3}$, the fourth input terminal $V_{in4}$, and the fifth input terminal $V_{in5}$.

Figures 7B, 8A:
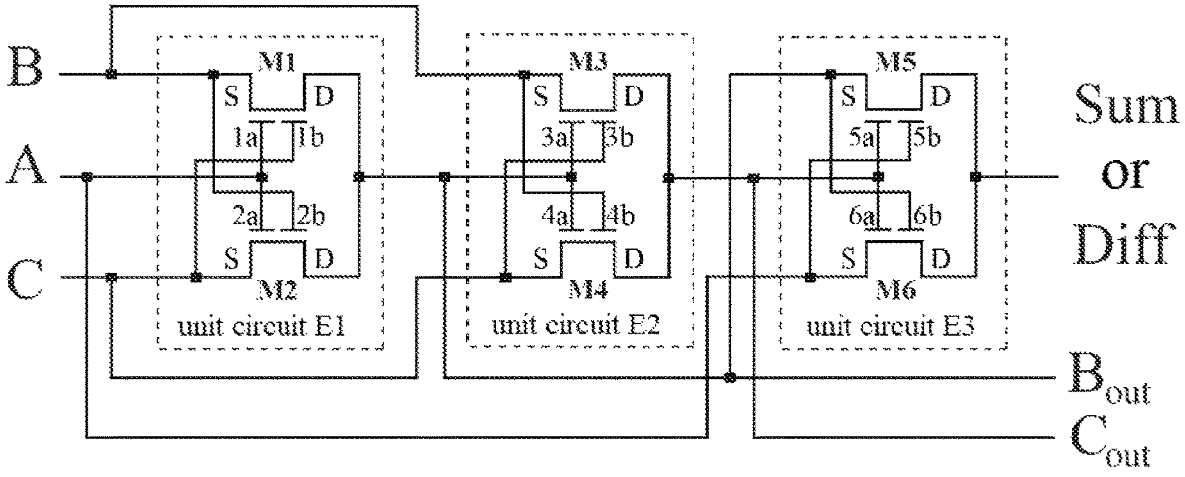
FIG. 7*b* is a schematic diagram of another logic circuit composed of the unit circuit of Embodiment 1: a function table of a multi-functional circuit.
FIG. 8*a* is a schematic diagram of the adder-subtractor circuit of Embodiment 1: a circuit structure diagram.

In the present embodiment, based on the circuit shown in FIG. 7*a* and according to the signal input operation mode shown in FIG. 7*b*, the 'AND gate' with the logical operation result of ABC, the 'AND-OR gate' with the logical operation result of AB+C, the 'OR-AND gate' with the logical operation result of (A+B)C, and the 'OR gate' with the logical operation result of A+B+C of three input signals can be implemented in sequence.

In order to realize the above logic functions, the specific implementation method is as follows:

(1) The first input terminal $V_{in1}$, the third input terminal $V_{in3}$, and the fourth input terminal $V_{in4}$ input the signals A, B, and C, respectively, if both the second input terminal $V_{in2}$ and the fifth input terminal $V_{in5}$ input a high level, then the AND gate is implemented, and the output terminal $V_{out}$ outputs ABC;

(2) If both the second input terminal $V_{in2}$ and the fifth input terminal $V_{in5}$ input a low level, then the OR gate is implemented, and the output terminal $V_{out}$ outputs A+B+C;

(3) If the second input terminal $V_{in2}$ is at a high level and the fifth input terminal $V_{in5}$ inputs a low level, then the AND-OR gate is implemented, and the output terminal $V_{out}$ outputs AB+C;

(4) If the second input terminal $V_{in2}$ is at a low level and the fifth input terminal $V_{in5}$ inputs a high level, then the OR-AND gate is implemented, and the output terminal $V_{out}$ outputs (A+B)C.

Further, as shown in FIG. 8*a*, the structure of the adder-subtractor circuit based on the tunable homojunction field effect device in the present embodiment includes three unit circuits, denoted as the first unit, the second unit, and the third unit, respectively. The specific connection method is:

The first input terminal of the first unit is connected to the first input terminal of the second unit, which serves as the first input terminal of the adder-subtractor logic circuit and inputs the signal B;

The second input terminal of the first unit is connected to the third input terminal of the third unit, which serves as the second input terminal of the adder-subtractor logic circuit and inputs the signal A;

The third input terminal of the first unit is connected to the third input terminal of the second unit, which serves as the third input terminal of the adder-subtractor logic circuit and inputs the signal C;

The output terminal of the first unit is connected to the second input terminal of the second unit and the first input terminal of the third unit, which serves as the first output terminal of the adder-subtractor logic circuit and outputs the signal $B_{out}$;

The output terminal of the second unit is connected to the second input terminal of the third unit, which serves as the second output terminal of the adder-subtractor logic circuit and outputs the signal $C_{out}$;

The output terminal of the third unit is used as the adder signal output terminal of the adder-subtractor logic circuit to output the signal Sum or the subtractor signal output terminal of the adder-subtractor logic circuit to output the signal Diff.

The specific structure of each unit and the connection mode between the various units are as follows:

For the first unit circuit, the input signal B is input to the source terminal (S) of the device M1 and the gate electrode (2*b*) near the drain terminal (D) of the device M2; the input signal C is input to the source terminal (S) of the device M2 and gate electrode (1*b*) near the drain terminal (D) of the device M1; the input signal A is input to the gate electrode (1*a*) near the source terminal (S) of the device M1 and the gate electrode (2*a*) near the source terminal (S) of the device M2. The output signal $B_{out}$ is output through the connection point of the drain terminals (D) of the device M1 and the device M2. The input signal and the output signal satisfy the Boolean logic operation: Bout=$B_{out}=BC+B\overline{A}+C\overline{A}$.

For the second unit circuit, the input signal B is input to the source terminal (S) of the device M3 and the gate electrode (4*b*) near the drain terminal (D) of the device M4. The input signal C is input to the source terminal (S) of device M4 and the gate electrode (3*b*) near the drain terminal (D) of the device M3. The output signal $B_{out}$ of the first unit circuit is input to the gate electrode (3*a*) near the source terminal (S) of the device M3 and the gate electrode (4*a*) near the source terminal (S) of the device M4. The output signal $C_{out}$ is output through the connection point of the drain terminals (D) of the device M3 and the device M4. The input signal and the output signal satisfy the Boolean logic operation: $C_{out}=BC+B\overline{B_{out}}+C\overline{B_{out}}+C\overline{B_{out}}=BC+BA+CA$.

For the third unit circuit, the output signal $B_{out}$ of the first unit circuit is input to the source terminal (S) of the device M5 and the gate electrode (6*b*) near the drain terminal (D) of the device M6. The input signal A is input to the source terminal (S) of the device M6 and the gate electrode (5*b*) near the drain terminal (D) of the device M5. The output signal $C_{out}$ of the second unit circuit is input to the gate electrode (5*a*) near the source terminal (S) of the device M5 and the gate electrode (6*a*) near the source terminal (S) of the device M6. The output signal Sum or Diff is output through the connection point of the drain terminals (D) of the device M5 and the device M6. The input signal and the output signal satisfy the Boolean logic operation: Sum (or Diff)=$AB_{out}+A\overline{C_{out}}+B_{out}\overline{C_{out}}=A\oplus B\oplus C$.

In the present embodiment, the input signals of the circuit are A, B, and C, and the output signals of the circuit are $B_{out}$, $C_{out}$, and Sum (or Diff). The output signals $B_{out}$ and Diff respectively represent results of the borrow operation and the difference operation of subtractor, and the output signals $C_{out}$ and Sum respectively represent results of the carry operation and the summation operation of adder. Thus, the logical operations of the adder and the subtractor are simultaneously realized based on the same circuit.

FIG. 8*b* is a truth table of input and output of the circuit of FIG. 8*a*, When A, B and C are all at a high level, the output terminal $B_{out}$ is at a high level, the output terminal $C_{out}$ is at a high level, and the output terminal Sum or Diff is at a high level;

When A and B are both at a high level and C is at a low level, the output terminal $B_{out}$ is at a low level, the output terminal $C_{out}$ is at a high level, and the output terminal Sum or Diff is at a low level;

When A and C are both at a high level and B is at a low level, the output terminal $B_{out}$ is at a low level, the output terminal $C_{out}$ is at a high level, and the output terminal Sum or Diff is at a low level;

When B and C are both at a low level and A is at a high level, the output terminal $B_{out}$ is at a low level, the output terminal $C_{out}$ is at a low level, and the output terminal Sum or Diff is at a high level;

When B and C are both at a high level and A is at a low level, the output terminal $B_{out}$ is at a high level, the output terminal $C_{out}$ is at a high level, and the output terminal Sum or Diff is at a low level;

When A and C are both at a low level and B is at a high level, the output terminal $B_{out}$ is at a high level, the output terminal $C_{out}$ is at a low level, and the output terminal Sum or Diff is at a high level;

When B and A are both at a low level and C is at a high level, the output terminal $B_{out}$ is at a high level, the output terminal $C_{out}$ is at a low level, and the output terminal Sum or Diff is at a high level;

When A, B, and C are all at a low level, the output terminal $B_{out}$ is at a low level, the output terminal $C_{out}$ is at a low level, and the output terminal Sum or Diff is at a low level.

By making full use of device functions, the logic unit circuit designed in the present invention has the ability to perform reconfigurable logic functions. Further, the logic circuit constructed by cascading unit circuits can not only perform logic functions of full adder, subtractor, etc. but also require greatly reduced transistor resources and occupied area compared with traditional CMOS technology. Therefore, the structure proposed by the present invention is simpler, and the design scheme for the circuit with reconfigurable logic function is highly competitive in terms of meeting the low power consumption application requirements in the future.

What is claimed is:

1. A tunable homojunction field effect device-based unit circuit, wherein the unit circuit E comprises:

a first input terminal $V_{in1}$ for receiving a first input voltage signal;

a second input terminal $V_{in2}$ for receiving a second input voltage signal;

a third input terminal $V_{in3}$ for receiving a third input voltage signal;

a first tunable homojunction field effect transistor M1, wherein a source S1 of the first tunable homojunction field effect transistor M1 is coupled to the first input terminal, a gate electrode 1*a* close to the source S1 is connected to the second input terminal, and a gate electrode 1*b* close to a drain of the first tunable homojunction field effect transistor M1 is coupled to the third input terminal;

a second tunable homojunction field effect transistor M2, wherein a source S2 of the second tunable homojunction field effect transistor M2 is coupled to the third input terminal, a gate electrode 2*a* close to the source S2 is connected to the second input terminal, and a gate electrode 2*b* close to a drain of the second tunable homojunction field effect transistor M2 is coupled to the first input terminal;

wherein the drain of the first tunable homojunction field effect transistor is connected to the drain of the second tunable homojunction field effect transistor, and an output of a connection point therebetween is used as an output terminal $V_{out}$;

wherein the first tunable homojunction field effect transistor M1 and the second tunable homojunction field effect transistor M2 have the same structure, comprising a substrate insulating material, a channel material layer, an insulating layer, and a metal electrode layer; the metal electrode layer comprises a drain electrode layer, a source electrode layer, a gate electrode layer A, and a gate electrode layer B, the gate electrode layer A and the gate electrode layer B are fabricated side by side on the substrate insulating material, and a gap is left between the gate electrode layer A and the gate electrode layers B to ensure electrical insulation therebetween, the insulating layer completely covers the gate electrode layer A and the gate electrode layer B, the drain electrode layer is placed on a left edge of the channel material layer above the gate electrode layer A, and the source electrode layer is placed on a right edge of the channel material layer above the gate electrode layer B, that is, the gate electrode layer A corresponds to the gate electrode 1*b* of M1, and the gate electrode layer A corresponds to the gate electrode 2*b* of M2, the gate electrode layer B corresponds to the gate electrode 1*a* of M1, and the gate electrode layer B corresponds to the gate electrode 2*a* of M2.

2. The tunable homojunction field effect device-based unit circuit according to claim 1, wherein if the first input terminal $V_{in1}$ and the third input terminal $V_{in3}$ input a signal A and a signal B, respectively, when the second input terminal $V_{in2}$ inputs a high level, the output terminal $V_{out}$ outputs an AND gate, and the logical operation result is AB, when the second input terminal $V_{in2}$ inputs a low level, the output terminal $V_{out}$ outputs an OR gate, and the logical operation result is A+B, when the second input terminal $V_{in2}$ inputs a signal C, the output terminal $V_{out}$ outputs a borrow operation in subtractions, and the logical operation result is $AB+A\overline{C}+BC$, if the first input terminal $V_{in1}$ and the second input terminal $V_{in2}$ input the signal A and the signal B, respectively, when the third input terminal $V_{in3}$ is at a high level, the output terminal $V_{out}$ outputs the logic operation result $A+\overline{B}$, and when the third input terminal $V_{in3}$ is at a low level, the output terminal $V_{out}$ outputs the logic operation result $A\overline{B}$;

if the third input terminal $V_{in3}$ inputs the signal A, and the first input terminal $V_{in1}$ and the second input terminal $V_{in2}$ are at the same level, the output terminal is a signal following, and the logical operation result is A;

If the third input terminal $V_{in3}$ inputs the signal A, the first input terminal $V_{in1}$ is at a high level, and the second input terminal $V_{in2}$ is at a low level, the output signal is always at a high level, if the first input terminal $V_{in1}$ is at a low level, and the second input terminal $V_{in2}$ is at a high level, the output signal is always at a low level;

if the first input terminal $V_{in1}$ and the third input terminal $V_{in3}$ are at opposite levels, and the input signal $V_{in2}$ is the input signal A, the output terminal $V_{out}$ implements a NOT gate, and the logical operation result is $\overline{A}$.

3. The tunable homojunction field effect device-based unit circuit according to claim 1, wherein a multi-functional logic circuit comprising two unit circuits, wherein the two unit circuits are denoted as a logic circuit E1 and a logic circuit E2, respectively, the output terminal corresponding to the logic circuit E1 is connected to the second input terminal of the logic circuit E2 to form a logic circuit with five input terminals and one output terminal, which are respectively denoted as a first input terminal $V_{in1}$, a second input terminal $V_{in2}$, a third input terminal $V_{in3}$, a fourth input terminal $V_{in1}$, and a fifth input terminal $V_{in5}$.

4. The tunable homojunction field effect device-based unit circuit according to claim 3, wherein if the first input terminal $V_{in1}$ and the third input terminal $V_{in3}$ input the signals A and B, respectively, and the fourth input terminal $V_{in2}$ and the fifth input terminal $V_{in5}$ input opposite levels, when the second input terminal $V_{in2}$ inputs a high level, an AND-OR gate is implemented with the logic operation result of $\overline{AB}$, when the second input terminal $V_{in2}$ inputs a low level, an OR-NOT gate is implemented with the logic operation result of $\overline{A+B}$;

if the fourth input terminal $V_{in4}$ and the fifth input terminal $V_{in5}$ input the signals A and B, respectively, the second input terminal $V_{in2}$ inputs the signal C, and the first input terminal $V_{in1}$ and the third input terminal $V_{in3}$ input opposite levels, a majority gate is implemented with the logic operation result of AB+BC+AC.

5. A multi-functional logic circuit, comprising two unit circuits according to claim 1, wherein the two unit circuits are denoted as a logic circuit E1 and a logic circuit E2, respectively, the output terminal corresponding to the logic circuit E1 is connected to the third input terminal of the logic circuit E2 to form a logic circuit with five input terminals and one output terminal $V_{om}$, which are respectively denoted as a first input terminal $V_{in1}$, a second input terminal $V_{in2}$, a third input terminal $V_{in3}$, a fourth input terminal $V_{in4}$, and a fifth input terminal $V_{in5}$.

6. The multi-functional logic circuit according to claim 5, wherein if the first input terminal $V_{in1}$, the third input terminal $V_{in3}$, and the fourth input terminal $V_{in4}$ input the signals A, B, and C, respectively, when both the second input terminal $V_{in2}$ and the fifth input terminal $V_{in5}$ input a high level, an AND gate is implemented, and the output terminal $V_{out}$ outputs ABC;

when both the second input terminal $V_{in2}$ and the fifth input terminal $V_{in5}$ input a low level, an OR gate is implemented, and the output terminal $V_{out}$ outputs A+B+C;

when the second input terminal $V_{in2}$ is at a high level and the fifth input terminal $V_{in5}$ inputs a low level, an AND-OR gate is implemented, and the output terminal $V_{out}$ outputs AB+C;

when the second input terminal $V_{in2}$ is at a low level and the fifth input terminal $V_{in5}$ inputs a high level, an OR-AND gate is implemented, and the output terminal $V_{out}$ outputs (A+B)C.

7. An adder-subtractor logic circuit, wherein the adder-subtractor logic circuit is formed by cascading three unit circuits according to claim 1, denoted as a first unit, a second unit, and a third unit, respectively, the specific connection method is as follows:

the first input terminal of the first unit is connected to the first input terminal of the second unit, which serves as the first input terminal of the adder-subtractor logic circuit and inputs a signal B;

the second input terminal of the first unit is connected to the third input terminal of the third unit, which serves as the second input terminal of the adder-subtractor logic circuit and inputs a signal A;

the third input terminal of the first unit is connected to the third input terminal of the second unit, which serves as the third input terminal of the adder-subtractor logic circuit and inputs a signal C;

the output terminal of the first unit is connected to the second input terminal of the second unit and the first input terminal of the third unit, which serves as the first output terminal of the adder-subtractor logic circuit and outputs a signal $B_{out}$;

the output terminal of the second unit is connected to the second input terminal of the third unit, which serves as the second output terminal of the adder-subtractor logic circuit and outputs a signal $C_{out}$;

the output terminal of the third unit is used as the adder signal output terminal of the adder-subtractor logic circuit to output a signal Sum or as the subtractor signal output terminal of the adder-subtractor logic circuit to output a signal Diff.

8. The adder-subtractor logic circuit according to claim 7, wherein the input signal and the output signal satisfy the Boolean logic operation: $B_{out}=BC+B\overline{A}+C\overline{A}$;

the input signal and the output signal satisfy the Boolean logic operation: $C_{out}=BC+B\overline{B_{out}}+C\overline{B_{out}}=BC+BA+CA$;

the input signal and the output signal satisfy the Boolean logic operation: $Sum/Diff=AB_{out}+A\overline{C_{out}}+B_{out}\overline{C_{out}}=A\oplus B\oplus C$, wherein the output signals $B_{out}$ and Diff respectively represent results of the borrow operation and the difference operation of subtractor, and the output signals $C_{out}$ and Sum respectively represent results of the carry operation and the summation operation of adder.

* * * * *